United States Patent
Santos et al.

(10) Patent No.: US 12,283,296 B2
(45) Date of Patent: *Apr. 22, 2025

(54) SPIN-TRANSFER TORQUE MAGNETORESISTIVE MEMORY DEVICE WITH A FREE LAYER STACK INCLUDING MULTIPLE SPACERS AND METHODS OF MAKING THE SAME

(71) Applicant: SANDISK TECHNOLOGIES, INC., Milpitas, CA (US)

(72) Inventors: Tiffany Santos, San Jose, CA (US); Neil Smith, San Jose, CA (US)

(73) Assignee: Sandisk Technologies, Inc., Milpitas, CA (US)

(*) Notice: Subject to any disclaimer, the term of this patent is extended or adjusted under 35 U.S.C. 154(b) by 483 days.

This patent is subject to a terminal disclaimer.

(21) Appl. No.: 17/575,840

(22) Filed: Jan. 14, 2022

(65) Prior Publication Data

US 2022/0139435 A1    May 5, 2022

Related U.S. Application Data

(63) Continuation of application No. PCT/US2020/025183, filed on Mar. 27, 2020, which
(Continued)

(51) Int. Cl.
*G11C 11/16*    (2006.01)
*H01F 10/32*    (2006.01)
(Continued)

(52) U.S. Cl.
CPC ........ *G11C 11/161* (2013.01); *H01F 10/3259* (2013.01); *H01F 10/3286* (2013.01);
(Continued)

(58) Field of Classification Search
None
See application file for complete search history.

(56) References Cited

U.S. PATENT DOCUMENTS 11,031,058 B2    6/2021    Santos et al.
2006/0262594 A1  11/2006   Fukumoto
(Continued)

OTHER PUBLICATIONS

H. Sato et al., "Perpendicular-anisotropy CoFeB—MgO magnetic tunnel junctions with a MgO/CoFeB/Ta/CoFeB/MgO recording structure", Appl. Phys. Lett. 101, 022414 (2012). 5 pages.
(Continued)

*Primary Examiner* — Bo B Jang
(74) *Attorney, Agent, or Firm* — THE MARBURY LAW GROUP PLLC

(57) ABSTRACT

A spin-transfer torque (STT) magnetoresistive memory device includes a first electrode, a second electrode, and a magnetic tunnel junction located between the first electrode and the second electrode. The magnetic tunnel junction includes a reference layer having a fixed magnetization direction, a free layer stack, and a nonmagnetic tunnel barrier layer located between the reference layer and the free layer stack. The free layer stack has a total thickness of less than 2 nm, and contains in order, a proximal ferromagnetic layer located proximal to the nonmagnetic tunnel barrier layer, a first non-magnetic metal sub-monolayer, an intermediate ferromagnetic layer, a second non-magnetic metal sub-monolayer, and a distal ferromagnetic layer.

4 Claims, 7 Drawing Sheets

Related U.S. Application Data is a continuation of application No. 16/558,552, filed on Sep. 3, 2019, now Pat. No. 11,031,058.

(51) Int. Cl.
| | |
|---|---|
| *H01F 41/32* | (2006.01) |
| *H10B 61/00* | (2023.01) |
| *H10N 50/01* | (2023.01) |
| *H10N 50/80* | (2023.01) |
| *H10N 50/85* | (2023.01) |

(52) U.S. Cl.
CPC .......... *H01F 10/329* (2013.01); *H01F 41/32* (2013.01); *H10B 61/00* (2023.02); *H10N 50/01* (2023.02); *H10N 50/80* (2023.02); *H10N 50/85* (2023.02)

(56) References Cited

U.S. PATENT DOCUMENTS

| | | |
|---|---|---|
| 2010/0080036 A1 | 4/2010 | Liu et al. |
| 2011/0001203 A1 | 1/2011 | Chen et al. |
| 2011/0133298 A1 | 6/2011 | Chen et al. |
| 2012/0306034 A1 | 12/2012 | Meng et al. |
| 2014/0264511 A1 | 9/2014 | De Brosse et al. |
| 2014/0264513 A1 | 9/2014 | De Brosse et al. |
| 2017/0125664 A1 | 5/2017 | Tahmasebi et al. |
| 2017/0294575 A1 | 10/2017 | Hu et al. |
| 2018/0047894 A1 | 2/2018 | Pinarbasi et al. |
| 2018/0096982 A1 | 4/2018 | Schafer |
| 2018/0102474 A1 | 4/2018 | Tang et al. |
| 2018/0102476 A1 | 4/2018 | Chepulskyy et al. |
| 2018/0108833 A1 | 4/2018 | Chepulskyy et al. |
| 2018/0123032 A1 | 5/2018 | Aggarwal et al. |
| 2018/0130943 A1 | 5/2018 | Naik et al. |
| 2018/0137904 A1 | 5/2018 | Mihajlovic et al. |
| 2018/0190898 A1 | 7/2018 | Wang et al. |
| 2018/0197589 A1 | 7/2018 | Tang et al. |
| 2018/0205001 A1 | 7/2018 | Beach et al. |
| 2018/0205009 A1 | 7/2018 | Schafer et al. |
| 2018/0219152 A1 | 8/2018 | Apalkov et al. |
| 2018/0226574 A1 | 8/2018 | Whig et al. |
| 2018/0247684 A1 | 8/2018 | Tang et al. |
| 2018/0248110 A1 | 8/2018 | Kardasz et al. |
| 2018/0248113 A1 | 8/2018 | Pinarbasi et al. |
| 2018/0261762 A1 | 9/2018 | Apalkov et al. |
| 2018/0269384 A1 | 9/2018 | Wang et al. |
| 2018/0269387 A1 | 9/2018 | Iwata et al. |
| 2018/0294024 A1 | 10/2018 | Schafer et al. |
| 2018/0309049 A1 | 10/2018 | Chepulskyy et al. |
| 2018/0315920 A1 | 11/2018 | Pinarbasi et al. |
| 2018/0350873 A1 | 12/2018 | Nikitin et al. |
| 2018/0351086 A1 | 12/2018 | Tang et al. |
| 2018/0358065 A1 | 12/2018 | Hu et al. |
| 2018/0358066 A1 | 12/2018 | Hu et al. |
| 2018/0358067 A1 | 12/2018 | Hu et al. |
| 2018/0358068 A1 | 12/2018 | Hu et al. |
| 2019/0006582 A1 | 1/2019 | Pinarbasi et al. |
| 2019/0019943 A1 | 1/2019 | Min et al. |
| 2019/0066747 A1 | 2/2019 | Lee et al. |
| 2019/0067366 A1 | 2/2019 | Lee et al. |
| 2019/0080738 A1 | 3/2019 | Choi et al. |
| 2019/0087250 A1 | 3/2019 | Slaughter et al. |
| 2019/0109278 A1 | 4/2019 | Kardasz et al. |
| 2019/0109281 A1 | 4/2019 | Doyle et al. |
| 2019/0123268 A1 | 4/2019 | Whig et al. |
| 2019/0157547 A1 | 5/2019 | Ikhtiar et al. |
| 2019/0157550 A1 | 5/2019 | Aggarwal et al. |
| 2019/0180900 A1 | 6/2019 | Sasaki |

OTHER PUBLICATIONS

Maria Patricia Rouelli Sabino et al., "Influence of Ta insertions on the magnetic properties of MgO/CoFeB/MgO films probed by ferromagnetic resonance", 2014 Appl. Phys. Express 7 093002, 5 pages.

M. Wang et al., "Current-induced magnetization switching in atom-thick tungsten engineered perpendicular magnetic tunnel junctions with large tunnel magnetoresistance", Nature Communications 9:671 (2018), 7pages.

J-H Kim et al., "Ultrathin W space layer-enabled thermal stability enhancement in a perpendicular MgO/CoFeB/W/CoFeB/MgO recording frame", Scientific Reports 5:16903 (2015), 7 pages.

J. Swerts et al., "BEOL compatible high tunnel magnetoresistance perpendicular magnetic tunnel junctions using a sacrificial Mg layer as CoFeB free layer cap", Appl. Phys. Lett. 106, 262407 (2015), https://doi.org/10.1063/1.4923420, 5 pages.

Notification of Transmittal of the International Search Report and Written Opinion of the International Search Authority for International Patent Application No. PCT/US2020/025183, mailed Jul. 30, 2020, 12 pages.

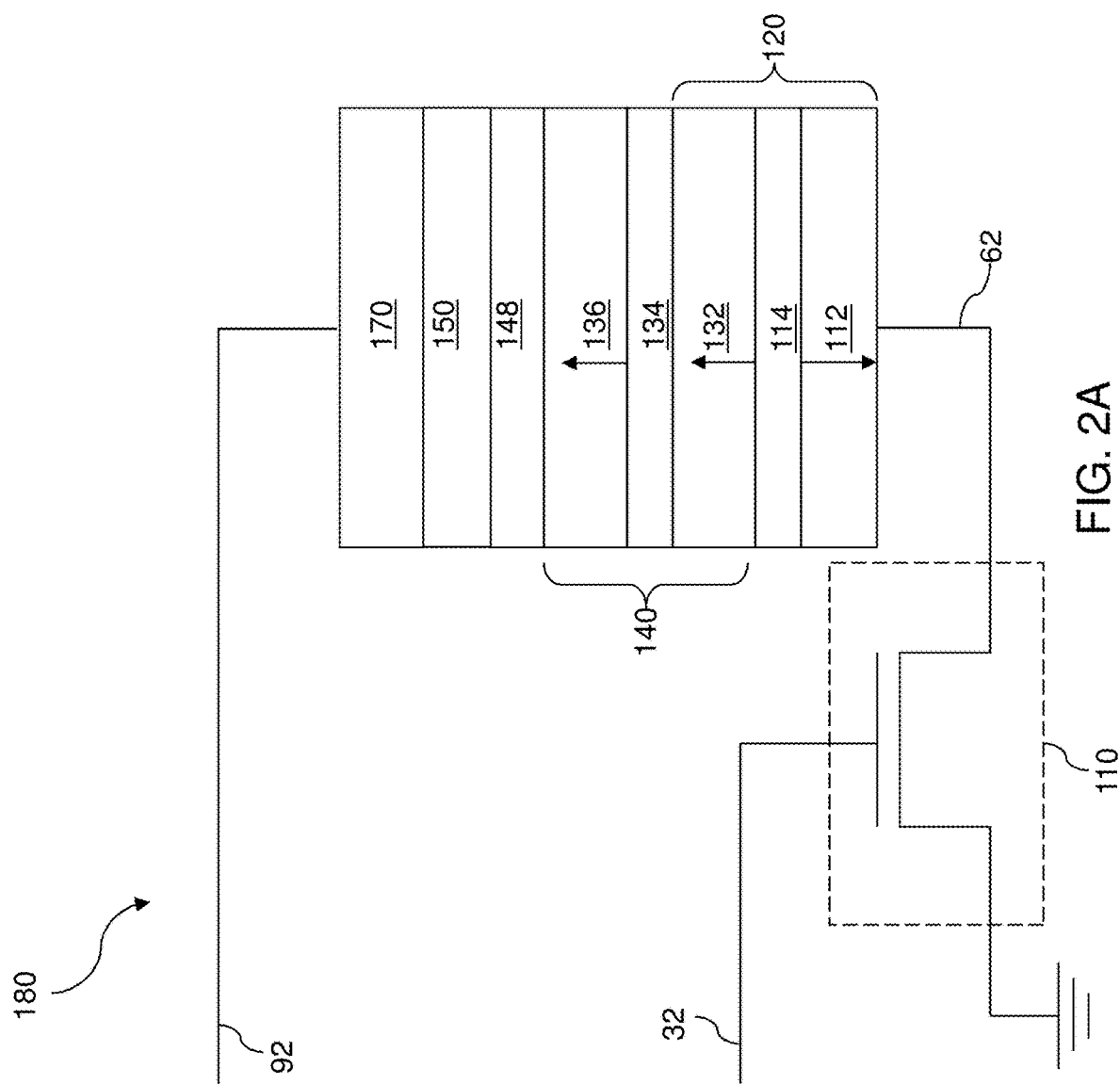

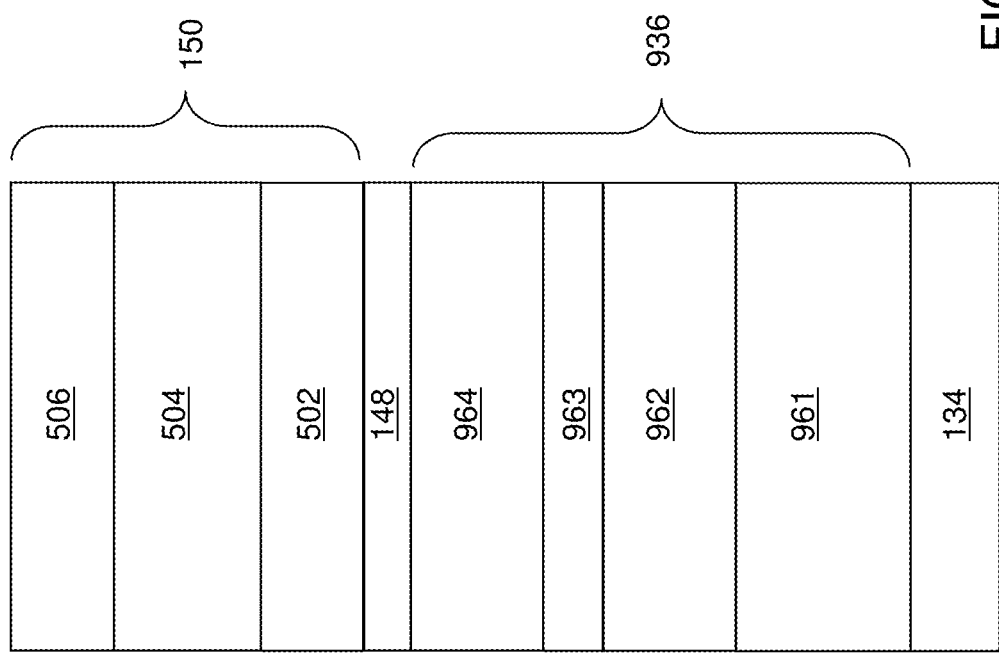

SPIN-TRANSFER TORQUE MAGNETORESISTIVE MEMORY DEVICE WITH A FREE LAYER STACK INCLUDING MULTIPLE SPACERS AND METHODS OF MAKING THE SAME

FIELD

The present disclosure relates generally to the field of magnetic memory devices and specifically to a spin-transfer torque (STT) magnetoresistive memory device with a free layer stack including multiple non-magnetic metal spacers and methods of making the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell depending if the magnetization of the free layer is parallel or antiparallel to the magnetization of the polarizer layer, also known as a reference layer.

SUMMARY

According to an aspect of the present disclosure, a spin-transfer torque (STT) magnetoresistive memory device includes a first electrode, a second electrode, and a magnetic tunnel junction located between the first electrode and the second electrode. The magnetic tunnel junction includes a reference layer having a fixed magnetization direction, a free layer stack, and a nonmagnetic tunnel barrier layer located between the reference layer and the free layer stack. The free layer stack has a total thickness of less than 2 nm, and contains in order, a proximal ferromagnetic layer located proximal to the nonmagnetic tunnel barrier layer, a first non-magnetic metal sub-monolayer, an intermediate ferromagnetic layer, a second non-magnetic metal sub-monolayer, and a distal ferromagnetic layer.

According to another aspect of the present disclosure, a method of forming a spin-transfer torque (STT) magnetoresistive memory device includes forming a reference layer having a fixed magnetization direction, forming a nonmagnetic tunnel barrier layer over the reference layer, and forming a free layer stack on the non-magnetic tunnel barrier layer by sequentially forming a proximal CoFeB layer, a first tungsten sub-monolayer, an intermediate CoFe or CoFeB layer, a second tungsten sub-monolayer, and a distal CoFe or CoFeB layer, wherein the free layer stack has a total thickness less than 2 nm.

BRIEF DESCRIPTION OF THE DRAWINGS

FIG. 2A illustrates an exemplary STT magnetoresistive memory device according to an embodiment of the present disclosure.

FIG. 3 illustrates a STT magnetoresistive memory device that includes a single tungsten sub-monolayer within a free layer stack according to a comparative example.

DETAILED DESCRIPTION

Figure 1:
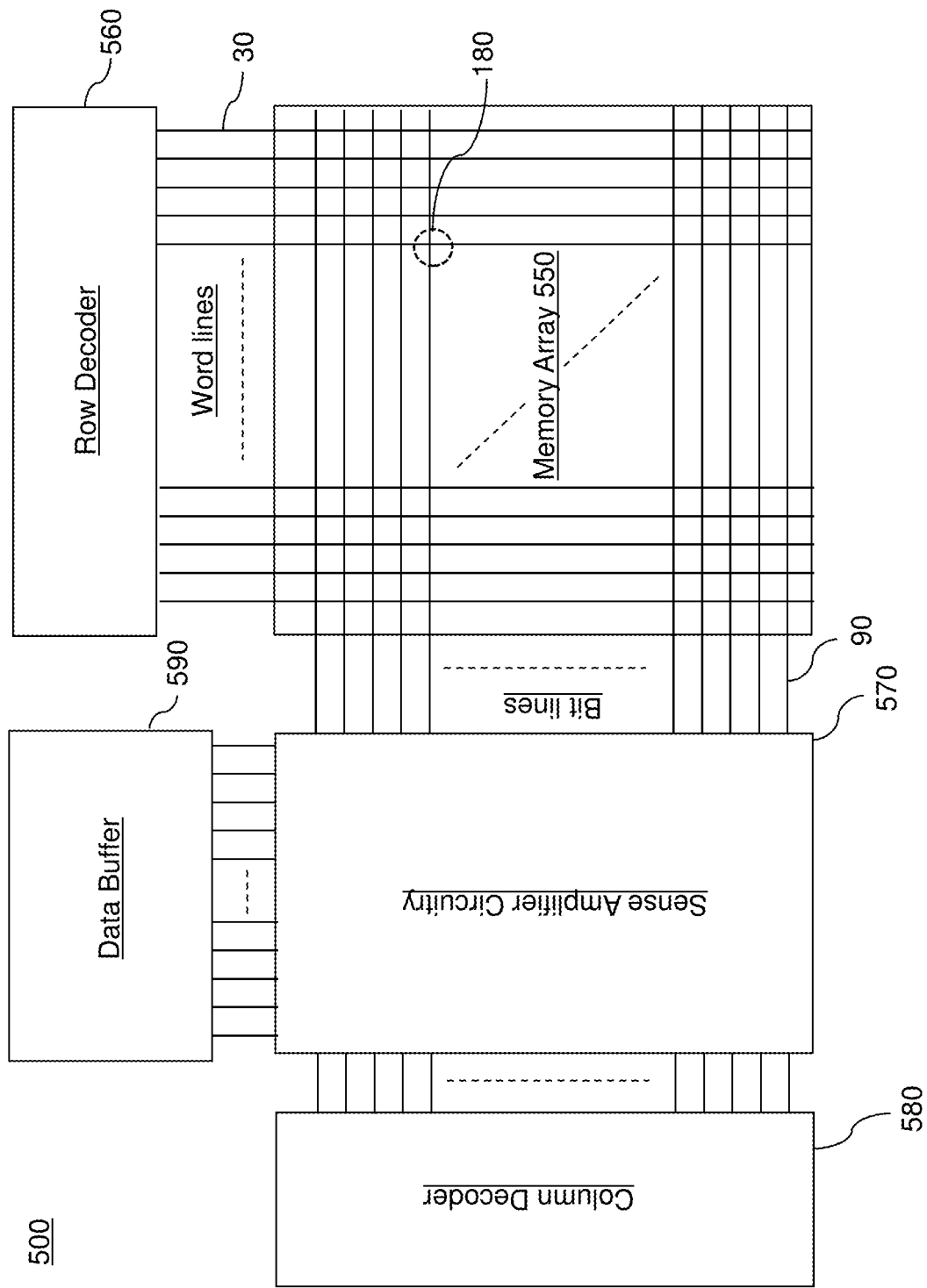
FIG. 1 is a schematic diagram of a memory device including resistive memory cells of the present disclosure in an array configuration.

As discussed above, the present disclosure is directed to a spin-transfer torque (STT) magnetoresistive memory device, such as an MRAM cell containing free layer stack including multiple ferromagnetic layers and multiple non-magnetic metal spacers and methods of making the same, the various aspects of which are described below.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" refers to a layer that has a predominant direction of extension, i.e., having a direction along which the layer extends the most.

Referring to FIG. 1, a schematic diagram is shown for a magnetic memory device including memory cells 180 of an embodiment of the present disclosure in an array configuration. The magnetic memory device can be configured as a MRAM device 500 containing MRAM cells 180. As used herein, a "MRAM device" refers to a memory device containing cells that allow random access, e.g., access to any selected memory cell upon a command for reading the contents of the selected memory cell.

The MRAM device 500 of an embodiment of the present disclosure includes a memory array region 550 containing an array of the respective MRAM cells 180 located at the intersection of the respective word lines (which may comprise electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). The MRAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the MRAM cells 180 are provided in an array configuration that forms the MRAM device 500. As such, each of the MRAM cells 180 can be a two-terminal device including a respective first electrode and a respective second electrode. It should be noted that the location and interconnection of elements are schematic and the elements may be arranged in a different configuration. Further, a MRAM cell 180 may be manufactured as a discrete device, i.e., a single isolated device.

Each MRAM cell 180 includes a magnetic tunnel junction or a spin valve having at least two different resistive states depending on the alignment of magnetizations of different magnetic material layers. The magnetic tunnel junction or the spin valve is provided between a first electrode and a second electrode within each MRAM cell 180. Configurations of the MRAM cells 180 are described in detail in subsequent sections.

Figure 2B:
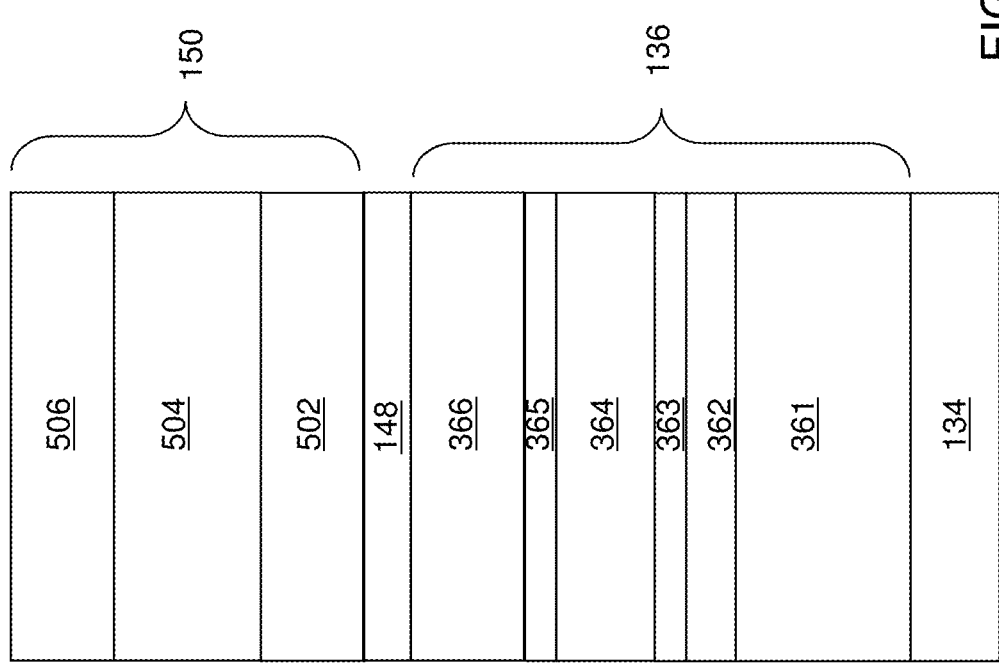
FIG. 2B is a magnified view of a portion of the exemplary STT magnetoresistive memory device of FIG. 2A.

Referring to FIGS. 2A and 2B, an exemplary STT magnetoresistive memory device is illustrated, which may comprise one MRAM cell 180 within the magnetic memory device illustrated in FIG. 1. According to an embodiment of the present disclosure, the MRAM cell 180 of the embodiments of the present disclosure may be a spin-transfer torque (STT) MRAM cell. MRAM cell 180 can include a first terminal 32 that may be electrically connected to, or comprises, a portion of a word line 30 (shown in FIG. 1) and a second terminal 92 that may be electrically connected to, or comprises, a portion of a bit line 90 (shown in FIG. 1). Alternatively, the first terminal 32 may be electrically connected to, or may comprise, a portion of a bit line 90 and the second terminal 92 may be electrically connected to, or may comprise, a portion of a word line 30. A first electrode 62 can be connected to the first terminal 32 via an optional switch, such as a field effect transistor 110, or can be directly connected to the first terminal 32. The second terminal 92 can function as a second electrode.

Generally, the STT MRAM cell 180 includes a magnetic tunnel junction (MTJ) 140. The magnetic tunnel junction 140 includes a reference layer 132 (which may also be referred to as a "pinned" layer) having a fixed vertical magnetization, a nonmagnetic tunnel barrier layer 134, and the free layer 136 (which may also be referred to as a "storage" layer) having a magnetization direction that can be programmed. The reference layer 132 and the free layer 136 can be separated by the nonmagnetic tunnel barrier layer 134 (such as an MgO layer), and have a magnetization direction perpendicular to the interface between the free layer 136 and the nonmagnetic tunnel barrier layer 134.

In one embodiment, the reference layer 132 is located below the nonmagnetic tunnel barrier layer 134, while the free layer 136 is located above the nonmagnetic tunnel barrier layer 134. An optional magnesium oxide capping layer 148 may be formed on top of the free layer 136 in order to provide additional perpendicular anisotropy. However, in other embodiments, the reference layer 132 is located above the nonmagnetic tunnel barrier layer 134, while the free layer 136 is located below the nonmagnetic tunnel barrier layer 134, or the reference layer 132 and the free layer 136 may be located on opposite lateral sides nonmagnetic tunnel barrier layer 134. In one embodiment, the reference layer 132 and the free layer 136 have respective positive uniaxial magnetic anisotropy. Positive uniaxial magnetic anisotropy is also referred to as perpendicular magnetic anisotropy (PMA) in which a minimum energy preference for quiescent magnetization is along the axis perpendicular to the plane of the magnetic film.

The configuration in which the reference layer 132 and the free layer 136 have respective perpendicular magnetic anisotropy provides bistable magnetization states for the free layer 136. The bistable magnetization states include a parallel state in which the free layer 136 has a magnetization (e.g., magnetization direction) that is parallel to the fixed vertical magnetization (e.g., magnetization direction) of the reference layer 132, and an antiparallel state in which the free layer 136 has a magnetization (e.g., magnetization direction) that is antiparallel to the fixed vertical magnetization (e.g., magnetization direction) of the reference layer 132.

A data bit can be written in the STT MRAM cell by passing high enough electrical current through the reference layer 132 and the free layer 136 in a programming operation so that spin-transfer torque can set or reset the magnetization state of the free layer 136. The direction of the magnetization of the free layer 136 after the programming operation depends on the current polarity with respect to magnetization direction of the reference layer 132. The data bit can be read by passing smaller electrical current through the STT MRAM cell and measuring the resistance of the STT MRAM cell. The data bit "0" and the data bit "1" correspond to low and high resistance states of the STT MRAM cell (or vice versa), which are provided by parallel or antiparallel alignment of the magnetization directions of the free layer 136 and the reference layer 132, respectively. The fractional resistance change between parallel (P) and antiparallel (AP) alignment (i.e., orientation) of the magnetization direction is called tunnel magnetoresistance (TMR), i.e., $TMR=(R_{AP}-R_P)/R_P$.

The reference layer 132 can include either a Co/Ni or Co/Pt multilayer structure. In one embodiment, the reference layer 132 can additionally include a thin non-magnetic layer comprised of tantalum or tungsten having a thickness of 0.2 nm-0.5 nm and a thin CoFeB layer (having a thickness in a range from 0.5 nm to 3 nm). The nonmagnetic tunnel barrier layer 134 can include any tunneling barrier material such as an electrically insulating material, for example magnesium oxide. The thickness of the nonmagnetic tunnel barrier layer 134 can be 0.7 nm to 1.3 nm, such as about 1 nm.

In one embodiment, the reference layer 132 may be provided as a component within a synthetic antiferromagnetic structure (SAF structure) 120. The SAF structure 120 can include a fixed (or "hard") ferromagnetic layer 112 with fixed magnetization along a vertical direction, an antiferromagnetic coupling layer 114, and the (aforementioned) reference layer 132 which remains adjacent to the tunnel barrier layer 134. The antiferromagnetic coupling layer 114 has a thickness that induces a strong antiferromagnetic coupling between the reference layer 132 and the fixed ferromagnetic layer 112, such that the antiferromagnetic coupling layer 114 can "lock in" antiparallel alignment between the fixed ferromagnetic layer 114 and the reference layer 132, which in turn "locks in" a particular (fixed) vertical direction of the magnetization of the reference layer 132. In one embodiment, the antiferromagnetic coupling layer can include ruthenium and can have a thickness in a range from 0.3 nm to 1 nm.

A primary challenge for manufacturing commercially viable STT MRAM devices is reduction of the critical switching current density $J_{c0}$ that is needed to switch the magnetization direction of the free layer 136 during a programming (writing) operation. However, it is also required that the MRAM cell be sufficiently thermally stable so that the magnetization direction of free layer does not spontaneously switch due to thermal activation while either in the quiescent state and/or during reading operation. The critical switching current density $J_{c0}$ is directly proportional to the film thickness $t_F$ of the free layer in an STT MRAM device. Thus, reducing the film thickness $t_F$ of the free layer in an STT MRAM device tends to reduce the switching current density $J_{c0}$. However, reducing the film thickness $t_F$ of the free layer typically results in an increase in a damping constant $\alpha$, which increases the switching current density $J_{c0}$. Reducing the film thickness $t_F$ often reduces the saturation magnetization $M_S$, thereby reducing the thermal stability $\Delta$.

The switching current density $J_{c0}$ is approximated by:

$$J_{c0} = \frac{2e\alpha}{\hbar\eta}\mu_0 M_s t_F H_k,$$

in which e is the charge of an electron, $\alpha$ is the damping constant, $\hbar$ is a reduced Planck constant, $\eta$ is an "efficiency factor" (typically close to 0.5), $\mu_0$ is the free space permeability, $M_s$ is the saturation magnetization of the free layer, and $H_k$ is the effective perpendicular anisotropy field in the free layer.

The thermal stability $\Delta$ of the free layer is commonly described in term of the stability-factor $\square$, which is approximately described by the following relation:

$$\Delta = \frac{\mu_0 M_s H_k V}{2 k_B T} = \frac{K_{eff} V}{k_B T} = \frac{K_{eff} t_F A}{k_B T}.$$

in which V is the volume of the free layer that is the same as the product of the film thickness $t_F$ of the free layer and the area A of the free layer, $k_B$ is the Boltzmann constant, and T is the temperature in Kelvin. The magnetic anisotropy density $K_{eff}$ is given by: $K_{eff} = \mu_0 M_s H_k/2$. Thus, the thermal stability $\Delta$ is given by: $\Delta = K_{eff} V/(k_B T)$. $J_{c0}$ and $\Delta$ have the same dependence on parameters $H_K M_s t_F$, making the design challenge of simultaneously decreasing $J_{c0}$ and maintaining sufficiently large $\Delta$ difficult, particularly when considering the commercial demand of higher density and lower write currents of MRAM memory cells which puts pressure on reducing cell size (or area A).

According to an aspect of the present disclosure, the free layer 136 can be formed as a multilayer stack including at least two sub-monolayer-thickness, non-magnetic, electrically conductive layers, such as non-magnetic metal layers, for example, tungsten or tantalum layers. According to an aspect of the present disclosure, the total film thickness of the free layer 136 stack is less than 2 nm, and preferably less than 1.5 nm, such as from 0.8 nm to 1.5 nm. Preferably the total film thickness of the free layer 136 stack is less than 1.5 nm, such as less than 1.3 nm, for example 1 nm to 1.2 nm. The thicknesses of the component layers within the free layer 136 stack of the embodiments of the present disclosure can be selected to minimize a collateral increase in the damping constant $\alpha$ and to minimize collateral reduction in the saturation magnetization $M_s$ that typically accompanies typical reduction in the total thickness of a free layer. In one embodiment, the fixed ferromagnetic layer 112, the antiferromagnetic coupling layer 114, the reference layer 132, the nonmagnetic tunnel barrier layer 134, and the free layer 136 can be sequentially deposited over a substrate, such as on the electrode 62.

According to an aspect of the present disclosure show in FIG. 2B, the free layer 136 stack can be formed by sequentially forming a CoFeB layer 361, an optional proximal CoFe layer 362 (which may, or may not, be present), a first non-magnetic metal sub-monolayer 363, an intermediate CoFe layer 364, a second non-magnetic metal sub-monolayer 365, and a distal CoFe layer 366. As used herein, a "distal" element refers to an element that is distal from the nonmagnetic tunnel barrier layer 134, and a "proximal" element refers to an element that is proximal to the nonmagnetic tunnel barrier layer 134.

The CoFeB layer 361 can be deposited, for example, by vacuum sputtering. The CoFeB layer 361 includes boron atoms at an atomic concentration in a range from 10% to 30%, and has a thickness in a range from 3 Angstroms to 6 Angstroms. In one embodiment, the atomic concentration of Co in the CoFeB layer 361 can be in a range from 12% to 20% (such as 15%), the atomic concentration of Fe in the CoFeB layer 361 can be in a range from 55% to 75% (such as 65%), and the atomic concentration of B in the CoFeB layer 361 can be in a range from 10% to 30% (such as 20%). In one embodiment, the CoFeB layer 361 can consist essentially of Co atoms, Fe atoms, and B atoms. In other words, the CoFeB layer 361 can be essentially free of impurity atoms. Any impurity atom in the CoFeB layer 361, if present, has an atomic concentration less than 1 parts per million. Preferably, the CoFeB layer 361 is deposited in the amorphous state on a crystalline MgO layer 134 which has a rocksalt crystal structure. During a subsequent anneal of the device, the CoFeB layer 361 crystallizes into a body-centered cubic crystal structure using the MgO layer 134 as a crystallization template, while some or all of the boron atoms diffuse away from the interface with the MgO layer 134 to overlying first and/or second non-magnetic metal sub-monolayers 363 and/or 365 which act as a boron sink. Thus, the proximal ferromagnetic layer 361 which contacts the MgO layer 134 may comprise a CoFe or CoFeB layer which has a body-centered cubic crystal structure to provide a coherent interface with the MgO layer 134, which is believed to lead to a higher TMR. In contrast, if a CoFe layer is deposited directly on the MgO layer 134, the CoFe layer may form as a crystalline layer having a different crystal structure that is not aligned with the rocksalt structure of the MgO layer 134, which would result in an undesirable non-coherent interface with the MgO layer 134, which may lead to a lower TMR.

The optional proximal CoFe layer 362, if employed, can be formed on the CoFeB layer 361, for example, by vacuum sputtering. The proximal CoFe layer 362 can have an equivalent thickness in a range from 0.6 Angstroms to 1.4 Angstroms. As used herein, an "equivalent thickness" is the product of the sputtering time and the sputtering rate in Angstroms per second, calibrated independently on thicker films for each material. A single monolayer of a material has an equivalent thickness of the monolayer of the material. A material that forms a fraction of a monolayer has an equivalent thickness of the fraction times the thickness of the monolayer of the material. If the fraction is less than one, then the material is a discontinuous layer in which the equivalent thickness can be less than the thickness of the monolayer of the material. The proximal CoFe layer 362 can be formed by depositing a CoFe alloy having an atomic concentration of cobalt in a range from 15% to 35% and having an atomic concentration of iron in a range from 70% to 85%. The deposited CoFe alloy can consist essentially of cobalt atoms and iron atoms. The proximal CoFe layer 362 can consist essentially of cobalt atoms, iron atoms, and residual boron atoms that diffuse out from the CoFeB layer 361 due to diffusion or surface roughness.

An optional sacrificial first magnesium layer having a thickness of 3 Angstroms to 10 Angstroms can be deposited on the top surface of proximal CoFe layer 362, for example, by vacuum sputtering. The first magnesium layer is a sacrificial protection layer that protects the proximal CoFe layer 362 and the CoFeB layer 361 from damage during subsequent deposition of a substantially heavier non-magnetic metal, such as tungsten.

The first non-magnetic metal sub-monolayer 363 can be formed on the proximal CoFe layer 362, for example, by vacuum sputtering, and may comprise tungsten or tantalum. The first magnesium layer is removed during formation of the first non-magnetic metal sub-monolayer 363 by metal (e.g., tungsten) atoms impinging thereupon. Transfer of kinetic energy from the metal atoms to the magnesium atoms of the first magnesium layer dislodges the magnesium atoms from the top surface of the proximal CoFe layer 362. Thus, the first non-magnetic metal sub-monolayer 363 and the proximal CoFe layer 362 can be substantially free of magnesium. As used herein, a "sub-monolayer" refers to a film having an average thickness less than one monolayer. A sub-monolayer can be a discontinuous layer having openings therethrough or can be a collection of individual atoms or clusters of atoms that do not form a continuous layer depending on the fractional number of an atomic layer that is present therein. In one embodiment, the first non-magnetic metal sub-monolayer 363 can have a thickness in a range from 0.1 Angstroms to 0.3 Angstroms. In one embodiment, the first non-magnetic metal sub-monolayer 363 comprises a first tungsten sub-monolayer. The diameter of a tungsten atom is about 2.1 Angstroms. Thus, the tungsten atoms within the first tungsten sub-monolayer 363 can be typically in the form of discrete tungsten atoms that do not contact any other tungsten atoms, or contact only one tungsten atom. The tungsten atoms in the first tungsten sub-monolayer 363 can act as boron sinks and combine with boron atoms that diffuse out of the CoFeB layer 361 during a subsequent high temperature anneal process, in which a coherent crystalline interface is formed between the nonmagnetic tunneling barrier layer 134 and the CoFeB layer 361 as boron atoms diffuse out of the interfacial region of the CoFeB layer 361 that contacts the nonmagnetic tunneling barrier layer 134. In one embodiment, the crystalline interface can be an MgO/CoFe interface or a MgO/CoFeB interface in case the nonmagnetic tunneling barrier layer 134 comprises an MgO layer.

The intermediate CoFe layer 364 can be formed on the first non-magnetic metal sub-monolayer 363, for example, by vacuum sputtering. The intermediate CoFe layer 364 can have an equivalent thickness in a range from 1.5 Angstroms to 4 Angstroms. The intermediate CoFe layer 364 can be formed by depositing a CoFe alloy having an atomic concentration of cobalt in a range from 15% to 35% and having an atomic concentration of iron in a range from 70% to 85%. The deposited CoFe alloy can consist essentially of cobalt atoms and iron atoms, and thus the intermediate CoFe layer 364 can consist essentially of cobalt atoms and iron atoms. Alternatively, the intermediate CoFe layer 364 can consist essentially of cobalt atoms, boron atoms and iron atoms An optional sacrificial second magnesium layer having a thickness of about 3 Angstroms to 10 Angstroms can be deposited on the top surface of intermediate CoFe layer 364, for example, by vacuum sputtering. The second magnesium layer is a sacrificial protection layer that protects the intermediate CoFe layer 364 during subsequent deposition of the non-magnetic metal, such as tungsten.

The second non-magnetic metal sub-monolayer 365 can be formed on the intermediate CoFe layer 364, for example, by vacuum sputtering. The second magnesium layer is removed during formation of the second non-magnetic metal sub-monolayer 365 by metal atoms (e.g., tungsten atoms) impinging thereupon. Transfer of kinetic energy from the metal atoms to the magnesium atoms of the second magnesium layer dislodges the magnesium atoms from the top surface of the intermediate CoFe layer 364. Thus, the second non-magnetic metal sub-monolayer 365 and the intermediate CoFe layer 364 can be substantially free of magnesium. In one embodiment, the second non-magnetic metal sub-monolayer 365 can have a thickness in a range from 0.1 Angstroms to 0.3 Angstroms. The metal atoms (e.g., tungsten atoms) within the second tungsten sub-monolayer 365 can be typically in the form of a discrete metal atoms (e.g., tungsten atoms) that do not contact any other tungsten atoms, or contact only one other tungsten atom.

The distal CoFe layer 366 can be formed on the second non-magnetic metal sub-monolayer 365, for example, by vacuum sputtering. The distal CoFe layer 366 can have an equivalent thickness in a range from 2 Angstroms to 4 Angstroms. The distal CoFe layer 366 can be formed by depositing a CoFe alloy having an atomic concentration of cobalt in a range from 15% to 35% and having an atomic concentration of iron in a range from 70% to 85%. The deposited CoFe alloy can consist essentially of cobalt atoms and iron atoms, and thus, the distal CoFe layer 366 can consist essentially of cobalt atoms and iron atoms. Alternatively, the distal CoFe layer 366 can consist essentially of cobalt atoms, boron atoms and iron atoms.

According to an aspect of the present disclosure, the thicknesses and the equivalent thicknesses of the various material layers within the free layer 136 stack can be selected such that the free layer 136 stack has a total thickness that is less than 2 nm, and preferably less than 1.5 nm. The compositions of each of the CoFeB layer 361, the proximal CoFe layer 362, the intermediate CoFe layer 364, and the distal CoFe layer 366 can be selected to maximize magnetization of the free layer 136. Thus, magnetization within each of the proximal CoFe layer 362, the intermediate CoFe layer 364, and the distal CoFe layer 366 is not diluted by any non-magnetic element other than the metal atoms (e.g., tungsten or tantalum atoms) of the first non-magnetic metal sub-monolayer 363 and the second non-magnetic metal sub-monolayer 365. In one embodiment, the free layer 136 consists essentially of Co atoms, Fe atoms, B atoms, and at least one of W or Ta atoms.

A magnesium oxide capping layer 148 can be optionally formed over the free layer 136 stack. In one embodiment, the magnesium oxide capping layer 148 can have a thickness in a range from 4 Angstroms to 10 Angstroms, although lesser and greater thicknesses can also be employed. Thus, the magnesium oxide capping layer 148 has a resistance-area product that is negligible or much smaller than the resistance-area product of the tunnel barrier layer 134. There is no ferromagnetic electrode on top of the magnesium oxide capping layer 148. Thus, the STT MRAM cell 180 is preferably a single tunnel junction device that includes only one magnetic tunnel junction 140.

A non-magnetic electrically conductive layer 150 can be formed on the magnesium oxide capping layer 148. The non-magnetic electrically conductive layer 150 includes at least one non-magnetic electrically conductive material such as tantalum, ruthenium, tantalum nitride, copper, and/or copper nitride. For example, the non-magnetic electrically conductive layer 150 can comprise a single layer or a layer stack including, from one side to another, a first ruthenium layer 502, a tantalum layer 504, and a second ruthenium layer 506. For example, the first ruthenium layer 502 can have a thickness in a range from 5 Angstroms to 15 Angstroms the tantalum layer 504 can have a thickness in a range from 10 Angstroms to 30 Angstroms and the second ruthenium layer 506 can have a thickness in a range from 5 Angstroms to 15 Angstroms.

In one embodiment, a nonmagnetic capping layer 170 can be formed over the non-magnetic electrically conductive layer 150. The nonmagnetic capping layer 170 can include a non-magnetic, electrically conductive material, such as W, Ti, Ta, WN, TiN, TaN, Ru, and Cu. The thickness of the nonmagnetic capping layer 170 can be in a range from 1 nm to 30 nm, although lesser and greater thicknesses can also be employed.

The layer stack including the SAF structure 120, the magnetic tunnel junction 140, the magnesium oxide capping layer 148, the non-magnetic electrically conductive layer 150, and the nonmagnetic capping layer 170 can be annealed to induce crystallographic alignment between the crystalline structure of the nonmagnetic tunnel barrier layer 134 (which may include crystalline MgO having a rock salt crystal structure) and the crystalline structure of the CoFeB layer 361 within the free layer 136. The metal (e.g., tungsten) atoms in the first non-magnetic metal sub-monolayer 363 can act as a boron sink for the boron atoms that diffuse out of the CoFeB layer 361 during the crystallization anneal process.

The location of the first and second terminals may be switched such that the first terminal is electrically connected to the SAF structure 120 and the second terminal is electrically connected to the capping layer 170. The layer stack including the material layers from the SAF structure 120 to the nonmagnetic capping layer 170 can be deposited in reverse order, i.e., from the SAF structure 120 toward the nonmagnetic capping layer 170 or from the nonmagnetic capping layer 170 toward the SAF structure 120. The layer stack can be formed as a stack of continuous layers, and can be subsequently patterned into discrete patterned layer stacks for each MRAM cell 180.

Optionally, each MRAM cell 180 can include a dedicated steering device, such an access transistor 110 (shown in FIG. 2A) or diode configured to activate a respective discrete patterned layer stack (120, 140, 148, 150, 170) upon application of a suitable voltage to the steering device. The steering device may be electrically connected between the patterned layer stack and one of the respective word lines 30 or bit lines 90 of the respective MRAM cell 180.

In one embodiment, the reference layer 132 has a fixed vertical magnetization that is perpendicular to an interface between the reference layer 132 and the nonmagnetic tunnel barrier layer 134. The free layer 136 stack has perpendicular magnetic anisotropy to provide bistable magnetization states that include a parallel state having a magnetization that is parallel to the fixed vertical magnetization and an antiparallel state having a magnetization that is antiparallel to the fixed vertical magnetization.

In one embodiment, the polarity of the voltage applied to the first terminal 92 can be changed depending on the polarity of the magnetization state to be programmed in the free layer 136 stack. For example, a voltage of a first polarity can be applied to the first terminal 92 (with respect to the second terminal 32) during a transition from an antiparallel state to a parallel state, and a voltage of a second polarity (which is the opposite of the first polarity) can be applied to the first terminal 92 during a transition from a parallel state to an antiparallel state. Further, variations in the circuitry for activating the discrete patterned layer stack (120, 140, 148, 150, 170) are also contemplated herein.

The magnetization direction of the free layer 136 stack can be flipped (i.e., from upward to downward or vice versa) by flowing electrical current through the discrete patterned layer stack (120, 140, 148, 150, 170). The magnetization of the free layer 136 stack can precess around the vertical direction (i.e., the direction of the flow of the electrical current) during the programming process until the spin transfer torque exerted by the spin-polarized electrical current flips the direction of the magnetization by 180 degrees, and at some subsequent point the flow of the electrical current can be stopped.

As discussed above, the free layer 136 stack includes two sub-monolayer-thickness non-magnetic metal layers (i.e., the first non-magnetic metal sub-monolayer 363 and the second non-magnetic metal sub-monolayer 365) such that a total film thickness of the free layer 136 stack is less than 2 nm. The thin free layer 136 stack of the embodiments of the present disclosure provides superior performance compared to prior art and comparative example STT memory devices which have a thicker free layer stack and/or only one non-magnetic metal sublayer. Without wishing to be bound by a particular theory or explanation, it is believed that plural non-magnetic metal sub-monolayers, such as plural tungsten monolayers, create additional points of contact between iron in CoFe or CoFeB ferromagnetic layers and the non-magnetic metal, such as tungsten. It is believed that the additional points of contact in a thin free layer stack increase the perpendicular magnetic anisotropy ("PMA") of free layer 136 without increasing damping or degrading the magnetic moment. It is also believed that thinning the individual nonmagnetic metallic layers, especially for heavy metals such as tungsten, to the sub-monolayer level eliminates excess damping due to additional spin-orbit coupling or spin-pumping into (an otherwise) thicker or continuous single metallic sublayer.

For example, Sabino et al., *Influence of Ta insertions on the magnetic properties of MgO/CoFeB/MgO films probed by ferromagnetic resonance*, Applied Physics Express 7, 093002 (2014) compared a free layer stack that included only one Ta layer to a free layer stack that included two Ta layers. The one Ta layer free layer stack included a 1 nm CoFeBe layer, 0.3 nm Ta layer and 0.5 to 1.5 nm CoFeB layer. The two Ta layer free layer stack included a 1 nm CoFeBe layer, 0.3 nm Ta layer, 0.5 to 1.5 nm CoFeB layer, 0.3 nm Ta layer, and 0.5 to 1.5 nm CoFeB layer. Thus, the total film thickness of the two Ta layer free layer stack of Sabino et al. article was 3.1 to 4.1 nm. According to the abstract of this article, increasing the number of Ta layer insertions to more than one does not improve magnetic anisotropy and increases a.

In contrast, as will be discussed below, adding two non-magnetic metal sub-monolayers into the free layer stack that has a film thickness less than 1.3 nm improves magnetic anisotropy without increasing a compared to a comparative example free layer stack having the same total layer thickness but only one non-magnetic metal sub-monolayer.

A first sample according to an embodiment of the present disclosure illustrated in FIG. 2B includes a free layer 136 stack containing a CoFeB layer 361 having a thickness of 4 Angstroms, a proximal CoFe layer 362 having an equivalent thickness of 1 Angstrom, a first tungsten sub-monolayer 363 having an equivalent thickness of 0.2 Angstroms, an intermediate CoFe layer 364 having an equivalent thickness of 2.5 Angstroms, a second tungsten sub-monolayer 365 having an equivalent thickness of 0.2 Angstrom, and a distal CoFe layer 366 having an equivalent thickness of 3 Angstroms, with a total film thickness of 10.9 Angstroms (i.e., 1.09 nm) for the free layer 136 stack.

The second sample according to a comparative example of the present disclosure shown in FIG. 3 includes a free layer 936 stack containing CoFeB layer 961 having a thickness of 4 Angstroms, a proximal CoFe layer 962 having an equivalent thickness of 3 Angstroms, a single tungsten sub-monolayer 963 having an equivalent thickness of 0.4 Angstroms, and a distal CoFe layer 964 having an equivalent thickness of 3.5 Angstroms, with a total film thickness of 10.9 Angstroms for the free layer 936 stack.

Thus, the thickness and the composition of the CoFeB layer 961 of the comparative example of FIG. 3 is the same as the thickness and the composition of the CoFeB layer 361 of the example of FIG. 2B. The sum of the thickness of the proximal CoFe layer 962 and the thickness of the distal CoFe layer 964 of the comparative example of FIG. 3 is the same as the sum of the thickness of the proximal CoFe layer 362, the thickness of the intermediate CoFe layer 364, and the thickness of the distal CoFe layer 366 of the example of FIG. 2B. The equivalent thickness of the tungsten sub-monolayer 963 of the comparative example of FIG. 3 is the same as the sum of the equivalent thickness of the first tungsten sub-monolayer 363 and the equivalent thickness of the second tungsten sub-monolayer 365 of the example of FIG. 2B.

Figure 4:
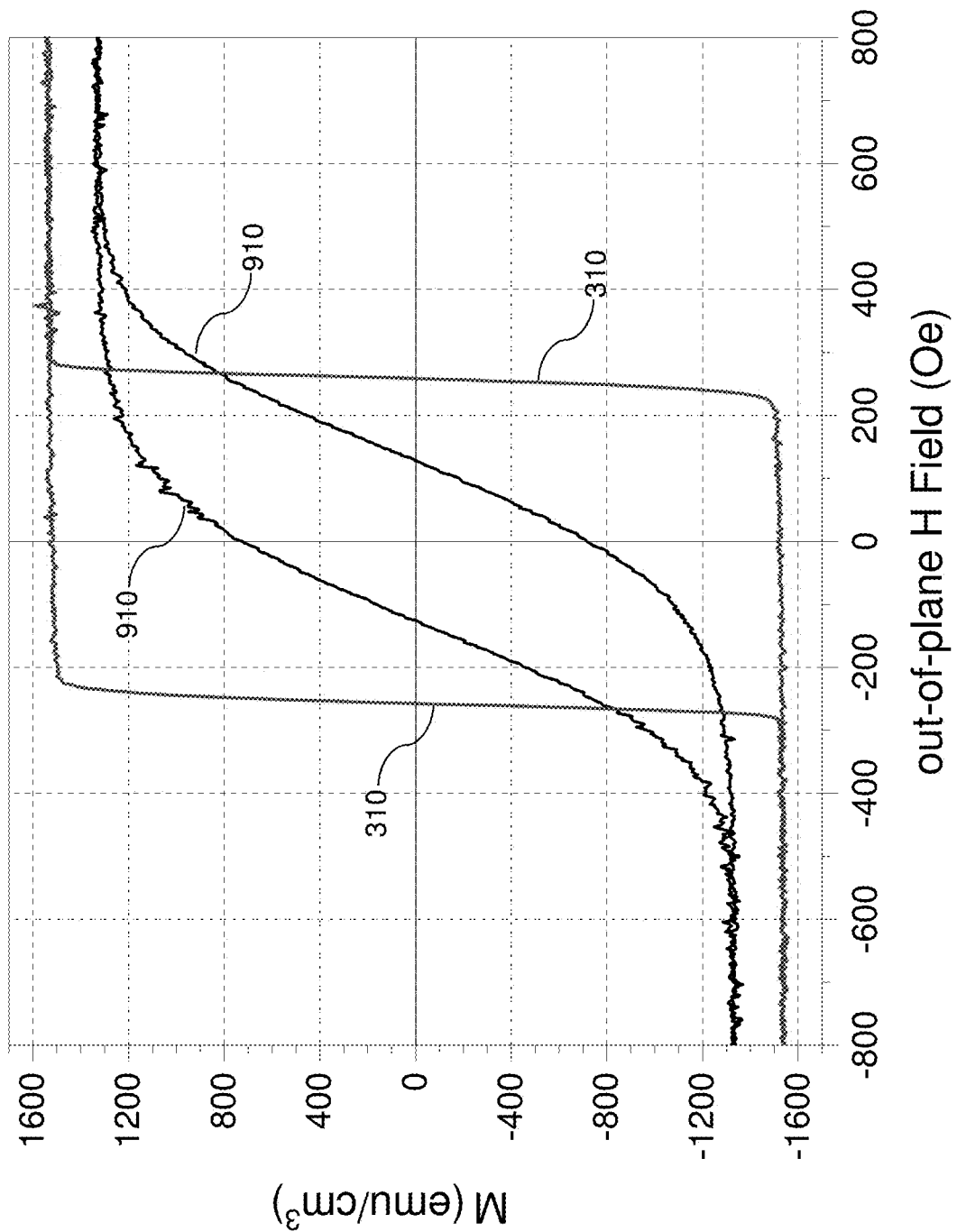
FIG. 4 is a plot of magnetization hysteresis curves as a function of out of plane magnetic field of the exemplary STT magnetoresistive memory device of FIG. 2B and of the comparative exemplary STT magnetoresistive memory device of FIG. 3.

FIG. 4 is a plot of the magnetization of the first sample according to the example of FIG. 2B and the second sample of the comparative exemplary structure of FIG. 3 as a function of out-of-plane (OOP) applied magnetic field H (i.e., an applied magnetic field along a vertical direction that is perpendicular to the interface between the nonmagnetic tunnel barrier layer 134 and the free layer (136 or 936) stack). The saturation magnetization $M_S$ is the magnetization level to which the magnetization saturates at high applied magnetic field. The first curve 310 is a hysteresis curve for the first sample of the example of FIG. 2B, and the second curve 910 is a hysteresis curve for the second sample of the comparative example of FIG. 3. Despite having the same total film thickness, the first sample displays superior characteristics compared to the second sample. First, the first sample displays a saturation magnetization of at least about 1,500 emu/cm$^3$ (e.g., up to 1604 emu/cm$^3$) compared to the saturation magnetization of about 1,300 emu/cm$^3$ for the second sample. Second, the first sample has a significant improvement of M(H) loop squareness compared to the second sample. Therefore, use of two tungsten sub-monolayers (363, 365) provides significantly superior performance for the exemplary free layer 136 stack compared to the comparative example free layer stack 936 having the same thickness and containing a single tungsten sub-monolayer 963 having about the same amount of tungsten atoms as the two tungsten sub-monolayers (363, 365).

Figure 5:
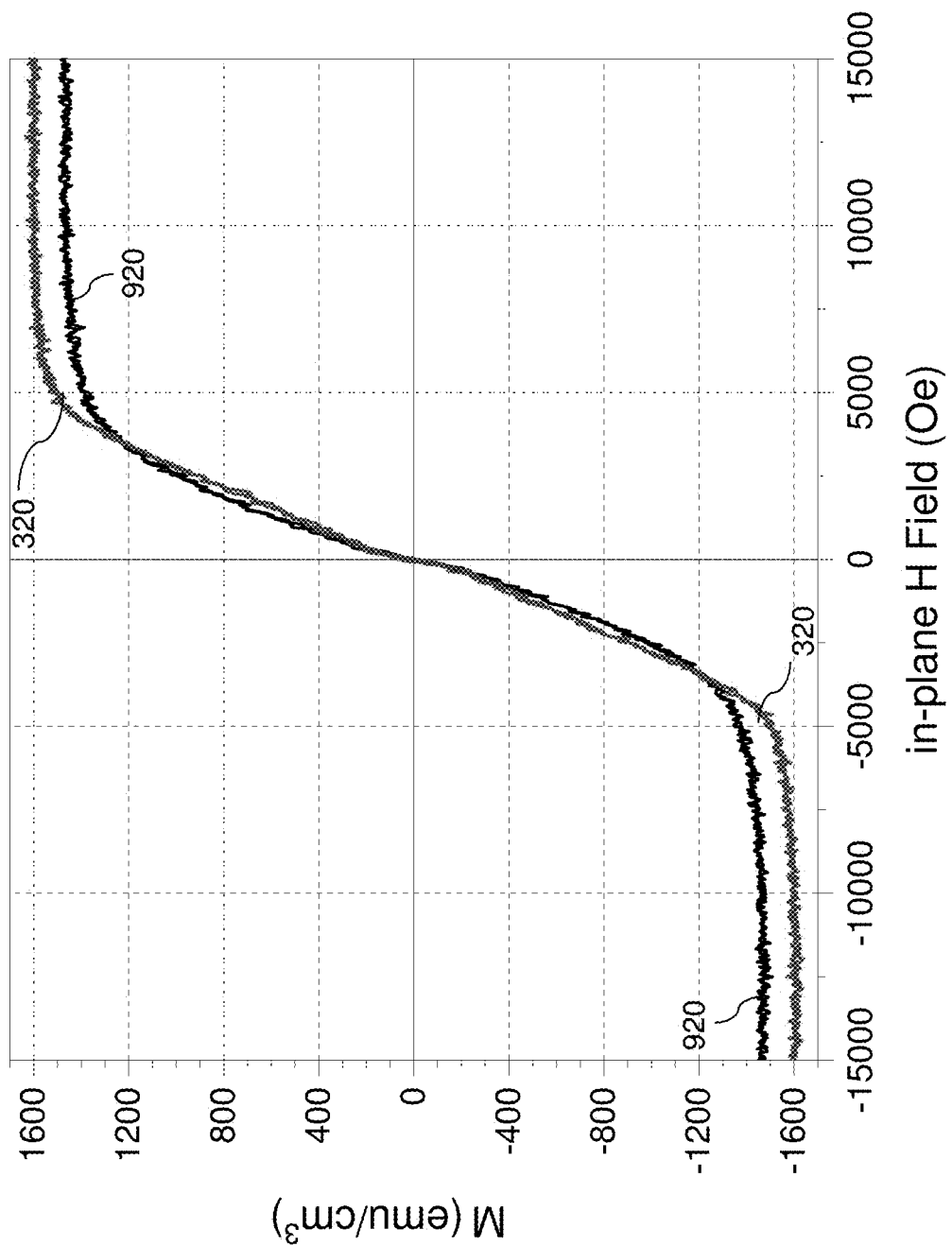
FIG. 5 is a plot of magnetization as a function of in plane magnetic field of the exemplary STT magnetoresistive memory device of FIG. 2B and of the comparative exemplary STT magnetoresistive memory device of FIG. 3.

FIG. 5 is a plot of the magnetization of the first sample according to the example of FIG. 2B, and the second sample of the comparative example FIG. 3 as a function of in-plane (IP) applied magnetic field H (i.e., an applied magnetic field within a plane parallel to the interface between the nonmagnetic tunnel barrier layer 134 and the free layer (136 or 936) stack). The first sample has significantly higher perpendicular magnetic anisotropy than the second sample. For example, the product of the effective anisotropy energy density ($K_{eff}$) times the free layer stack thickness $t_F$ (evaluated from the integrated area bound by the M(H) curve, the y-axis and M=$M_S$), referred to as $K_{eff} \cdot t_F$, of the first sample with free layer 136 according to the example of FIG. 2B is 0.41 erg/cm$^2$, while the $K_{eff} \cdot t_F$ product of the second sample with free layer 936 according to the comparative example of FIG. 3 is 0.32 erg/cm$^2$. Sufficiently large $K_{eff} \cdot t_F$ products are necessary for achieving adequate thermal stability at the MRAM cell level.

Figure 6:
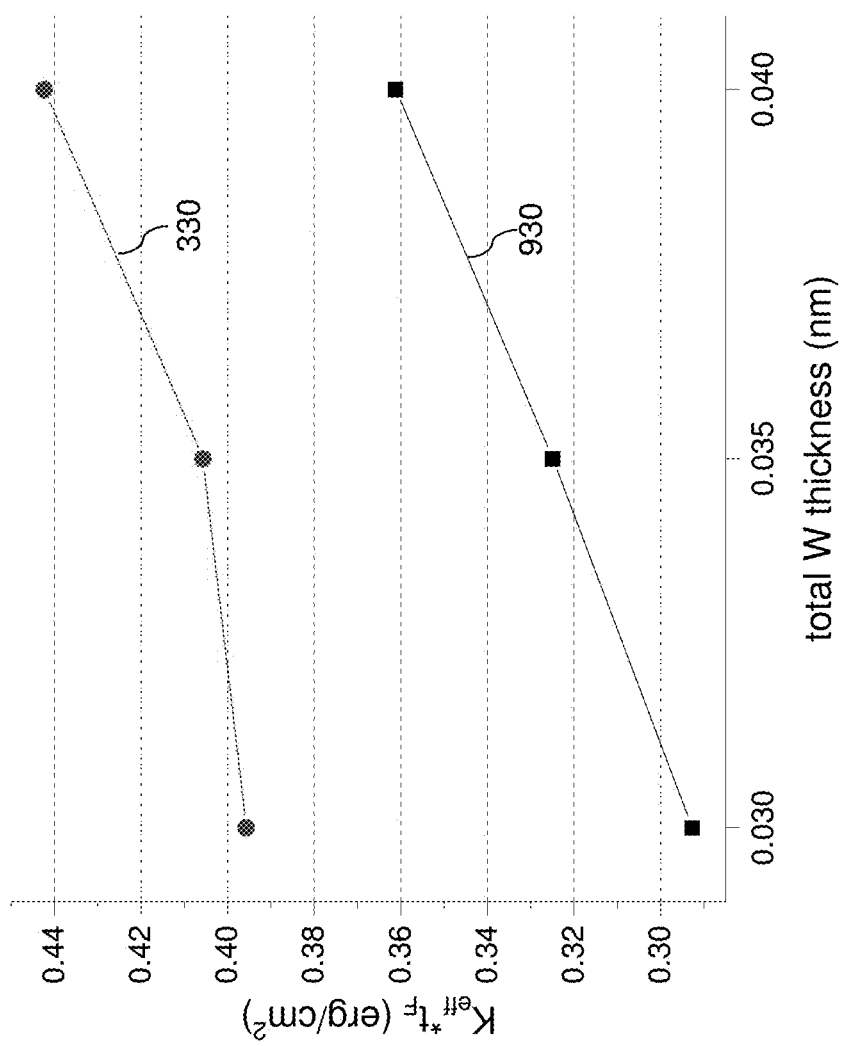
FIG. 6 is a plot of a product of the effective magnetic anisotropy energy density and the thickness of the free layer stack as a function of the total thickness of at least one tungsten sub-monolayer within the free layer stack of the exemplary STT magnetoresistive memory device of FIG. 2B and of the comparative exemplary STT magnetoresistive memory device of FIG. 3.

FIG. 6 illustrates the dependence of the $K_{eff} \cdot t_F$ product for the free layer (136 or 936) stacks as a function of the total thickness of at least one tungsten sub-monolayer {(363, 365) or 963} within the free layer (136 or 936) stacks of the first and second samples with curves 330 and 930. For a total thickness of the at least one tungsten sub-monolayer {(363, 365) or 963} between 0.3 Angstroms and 0.4 Angstroms, the exemplary free layer 136 stack of FIG. 2B containing a 4.5 Angstrom thick proximal CoFeB layer 361, a 3 Angstrom thick intermediate CoFe layer 364 and a 3.75 Angstrom thick distal CoFe layer 365 has a $K_{eff} \cdot t_F$ product of the free layer 136 stack in a range from 0.38 erg/cm$^2$ to 0.45 erg/cm$^2$, while the free layer 936 stack of the comparative example of FIG. 3 containing the same thickness ferromagnetic layers but only one tungsten sub-monolayer 963 has a $K_{eff} \cdot t_F$ product of less than 0.38 erg/cm$^2$ (e.g., 0.31 to 0.36 erg/cm$^2$).

Table I below illustrates results of comparative ferromagnetic resonance ("FMR") measurements data for the anisotropy field $H_K$, damping α, and inhomogeneous broadening $\Delta H|_{f \to 0}$ for the exemplary free layer 136 stack of exemplary samples 4 and 6 according to the embodiment of FIG. 2B and the comparative example free layer stack 936 of comparative example samples 3 and 5 according to the comparative example of FIG. 3.

TABLE I

| Sample number | $H_{k\perp}$ (kOe) | α | $\Delta H|_{f\to 0}$ (Oe) |
|---|---|---|---|
| Sample 3 according to comparative example of FIG. 3. 4.5Å CoFeB/3Å CoFe/0.4Å W/3.75Å CoFe | 3.02 | 0.0040 | 420 |
| Sample 4 according to example of FIG. 2B. 4.5Å CoFeB/0.2Å W/3Å CoFe/0.2Å W/3.75Å CoFe | 4.07 | 0.0037 | 125 |
| Sample 5 according to comparative example of FIG. 3. 4Å CoFeB/3Å CoFe/0.4Å W/3.5Å CoFe | 3.06 | 0.01 ± 0.01 | ~1200 |
| Sample 6 according to example of FIG. 2B. 4Å CoFeB/1Å CoFe/0. Å W/2.5Å CoFe/0.2Å W/3Å CoFe | 3.82 | 0.0058 | 410 |

Higher anisotropy field $H_K$, lower damping α, and lower inhomogeneous broadening $\Delta H|_{f\to 0}$ are observed for the exemplary free layer 136 stack of exemplary samples 4 and 6 according to the embodiment of FIG. 2B than for the comparative example free layer stack 936 of comparative example samples 3 and 5 according to the comparative example of FIG. 3. Inhomogeneous broadening $\Delta H|_{f\to 0}$ of the FMR signal results from a dispersion of perpendicular magnetic anisotropy in the free layer stack. It is an indicator of film uniformity and overall film quality. Larger inhomogeneous broadening has been experimentally correlated with substantially lower free layer coercivity and reduced thermal stability at the MRAM cell level (despite possibly similar $K_{eff}\cdot t_F$ product at the film level). Lower inhomogeneous broadening is better than high inhomogeneous broadening. Notably, there is a factor of 3 difference in the inhomogeneous broadening $\Delta H|_{f\to 0}$ for comparative example samples 3 and 4, and for comparative example samples 5 and 6.

Referring to FIGS. 1, 2A, 2B, and 4-6 and according to various embodiment of the present disclosure, a spin-transfer torque (STT) magnetoresistive memory device includes a first electrode 62, a second electrode 92, a magnetic tunnel junction 140 located between the first electrode and the second electrode, the magnetic tunnel junction 140 comprising a reference layer 132 having a fixed magnetization direction, a free layer 136 stack, and a nonmagnetic tunnel barrier layer 134 located between the reference layer 132 and the free layer 136 stack. The free layer 136 stack has a total thickness of less than 2 nm, and comprises, in order, a proximal ferromagnetic layer 361 located proximal to the nonmagnetic tunnel barrier layer 134, a first non-magnetic metal sub-monolayer 363, an intermediate ferromagnetic layer 364, a second non-magnetic metal sub-monolayer 365, and a distal ferromagnetic layer 366.

In one embodiment, the proximal ferromagnetic layer comprises a proximal CoFeB layer 361, the first non-magnetic metal sub-monolayer comprises a tungsten sub-monolayer 363, the intermediate ferromagnetic layer comprises an intermediate CoFe or CoFeB layer 364, the second non-magnetic metal sub-monolayer comprises a second tungsten sub-monolayer 365, and the distal ferromagnetic layer comprises a distal CoFe or CoFeB layer 366.

In one embodiment, the STT magnetoresistive memory device further comprises a proximal CoFe layer 362 located between the proximal CoFeB layer 361 and the first tungsten sub-monolayer 363. In one embodiment, the free layer 136 stack has a total thickness of less than 1.5 nm; the proximal CoFeB layer 361 has a thickness in a range from 3 Angstroms to 6 Angstroms; the proximal CoFe layer 362 has an equivalent thickness in a range from 0.6 Angstroms to 1.4 Angstroms; the intermediate CoFe or CoFeB layer 364 has an equivalent thickness in a range from 1.5 Angstroms to 4.0 Angstroms; the distal CoFe or CoFeB layer 366 has a thickness in a range from 2.0 Angstroms to 4.5 Angstroms; the first tungsten sub-monolayer 363 has a thickness in a range from 0.1 Angstrom to 0.5 Angstrom; and the second tungsten sub-monolayer 365 has a thickness in a range from 0.1 Angstrom to 0.5 Angstrom.

In one embodiment, the proximal CoFeB layer 361 includes boron at an atomic concentration in a range from 10% to 30%, cobalt at an atomic concentration in a range from 12% to 20%, and iron at an atomic concentration in a range from 55% to 75%. If the intermediate layer 364 and/or the distal layer 366 comprise CoFeB, then the intermediate and/or distal CoFeB layers include boron at an atomic concentration in a range from 10% to 30%, cobalt at an atomic concentration in a range from 12% to 20%, and iron at an atomic concentration in a range from 55% to 75%. If the intermediate layer 364 and/or the distal layer 366 comprise CoFe, then the proximal, the intermediate and the distal CoFe layers (362, 364, 366) include cobalt at an atomic concentration in a range from 15% to 35%, and iron at an atomic concentration in a range from 70% to 85%. In one embodiment, the proximal CoFeB layer 361 and the free layer 136 stack each consist essentially of Co atoms, Fe atoms, B atoms, and W atoms.

In one embodiment, the proximal CoFeB layer 361 is in contact with the nonmagnetic tunnel barrier layer 134, which comprises MgO, the first and the second tungsten sub-monolayers (363, 365) are discontinuous and the free layer 136 stack has a total thickness from 1 nm to 1.2 nm.

In one embodiment, the proximal ferromagnetic layer 361 is thicker than the intermediate ferromagnetic layer 364 and the STT magnetoresistive memory device comprises a STT MRAM cell 180 that includes only one magnetic tunnel junction 140.

In one embodiment, the free layer 136 stack has a saturation magnetization of at least about 1,500 emu/cm$^3$ and a product of magnetic anisotropy density and film thickness in a range from 0.38 erg/cm$^2$ to 0.45 erg/cm$^2$.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a spin-transfer torque (STT) magnetoresistive memory device, comprising:
   forming a reference layer having a fixed magnetization direction;
   forming a nonmagnetic tunnel barrier layer over the reference layer; and
   forming a free layer stack on the non-magnetic tunnel barrier layer by sequentially forming a proximal ferromagnetic layer, an intermediate ferromagnetic layer, a magnesium layer on a top surface of the intermediate ferromagnetic layer, a non-magnetic metal sub-monolayer having a thickness in a range from 0.1 Angstrom to 0.3 Angstrom and comprising tungsten, and a distal ferromagnetic layer;
   wherein the proximal ferromagnetic layer comprises a proximal CoFeB layer, the intermediate ferromagnetic layer comprises an intermediate CoFe layer, and the distal ferromagnetic layer comprises a distal CoFe layer; and
   wherein the magnesium layer is removed during formation of the non-magnetic metal sub-monolayer by atoms of the tungsten impinging on the magnesium layer.

2. A spin-transfer torque (STT) magnetoresistive memory device, comprising:
   a first electrode;
   a second electrode; and
   a magnetic tunnel junction located between the first electrode and the second electrode, the magnetic tunnel junction comprising a reference layer having a fixed magnetization direction, a free layer stack, and a non-magnetic tunnel barrier layer located between the reference layer and the free layer stack,
   wherein the free layer stack comprises, in order, a proximal ferromagnetic layer located proximal to the non-magnetic tunnel barrier layer, an intermediate ferromagnetic layer, a non-magnetic metal sub-monolayer having a thickness in a range from 0.1 Angstrom to 0.3 Angstrom and comprising tungsten or tantalum, and a distal ferromagnetic layer;
   wherein the free layer stack further comprises an additional ferromagnetic layer which directly contacts the proximal ferromagnetic layer and is located between the proximal ferromagnetic layer and the intermediate ferromagnetic layer.

3. A method of forming a spin-transfer torque (STT) magnetoresistive memory device, comprising:
   forming a reference layer having a fixed magnetization direction;
   forming a nonmagnetic tunnel barrier layer over the reference layer;
   sequentially forming a proximal ferromagnetic layer and an intermediate ferromagnetic layer;
   forming a magnesium layer on a top surface of the intermediate ferromagnetic layer;
   forming a non-magnetic metal layer, wherein the magnesium layer is removed during formation of the non-magnetic metal layer by atoms of the non-magnetic metal layer impinging on the magnesium layer; and
   forming a distal ferromagnetic layer on the non-magnetic metal layer to form a free layer stack comprising the proximal ferromagnetic layer, the intermediate ferromagnetic layer, the non-magnetic metal layer, and the distal ferromagnetic layer.

4. The method of claim 3, wherein:
   the non-magnetic metal layer comprises tungsten;
   the intermediate ferromagnetic layer comprises CoFeB; and
   the nonmagnetic tunnel barrier layer comprises magnesium oxide.

* * * * *